(12) United States Patent
Sun et al.

(10) Patent No.: US 9,394,615 B2
(45) Date of Patent: Jul. 19, 2016

(54) PLASMA RESISTANT CERAMIC COATED CONDUCTIVE ARTICLE

(71) Applicant: Applied Materials, Inc., Santa Clara, CA (US)

(72) Inventors: Jennifer Y. Sun, Mountain View, CA (US); Biraja P. Kanungo, San Jose, CA (US); Ren-Guan Duan, Fremont, CA (US); Hamid Noorbakhsh, Fremont, CA (US); Junhan Yuh, Palo Alto, CA (US); Dmitry Lubomirsky, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 705 days.

(21) Appl. No.: 13/687,512

(22) Filed: Nov. 28, 2012

(65) Prior Publication Data

US 2013/0284373 A1 Oct. 31, 2013

Related U.S. Application Data

(60) Provisional application No. 61/639,661, filed on Apr. 27, 2012.

(51) Int. Cl.
| | |
|---|---|
| *C23F 1/08* | (2006.01) |
| *B05D 3/00* | (2006.01) |
| *B23K 10/00* | (2006.01) |

(Continued)

(52) U.S. Cl.
CPC . *C23F 1/08* (2013.01); *B05D 3/002* (2013.01); *B23K 10/00* (2013.01); *C04B 41/87* (2013.01); *H01J 37/32467* (2013.01); *H01J 37/32477* (2013.01); *H01J 37/32495* (2013.01); *H05K 1/053* (2013.01); *B32B 18/00* (2013.01); *C04B 5/00* (2013.01); *C04B 7/32* (2013.01); *C04B 18/023* (2013.01); *C04B 28/06* (2013.01); *C04B 35/44* (2013.01); *C04B 41/009* (2013.01); *C04B 41/50* (2013.01); *C04B 41/5045* (2013.01); *C22C 29/12* (2013.01); *C22C 32/00* (2013.01); *C22C 32/0015* (2013.01); *C22C 32/0021* (2013.01); *C22C 32/0026* (2013.01);

(Continued)

(58) Field of Classification Search
CPC .......... C04B 5/00; C04B 7/32; C04B 18/023; C04B 28/06; C04B 35/44; C04B 41/50; C04B 41/009; C04B 41/5045; C04B 41/87; C22C 32/0026; C22C 32/00; C22C 32/0021; C22C 29/12; C22C 32/0015; B32B 18/00
USPC ............... 156/345.1; 118/723 R; 75/235, 301
See application file for complete search history.

(56) References Cited

U.S. PATENT DOCUMENTS

| | | | |
|---|---|---|---|
| 5,631,803 A | 5/1997 | Cameron et al. | |
| 5,800,871 A | 9/1998 | Collins et al. | |

(Continued)

FOREIGN PATENT DOCUMENTS

| | | |
|---|---|---|
| JP | 2006-207012 A | 8/2006 |
| JP | 2010-229492 A | 10/2010 |
| WO | WO2013155220 A1 | 10/2013 |

*Primary Examiner* — Rudy Zervigon
(74) *Attorney, Agent, or Firm* — Lowenstein Sandler LLP (57) ABSTRACT

To manufacture a ceramic coated article, at least one surface of a conductive article is roughened to a roughness of approximately 100 micro-inches (μin) to approximately 300 μin. The conductive article may then be heated and coated with a ceramic coating comprising a yttrium containing oxide to a thickness of approximately 10-40 mil.

20 Claims, 9 Drawing Sheets

(51) Int. Cl.

| | | |
|---|---|---|
| *H05K 1/05* | (2006.01) | |
| *H01J 37/32* | (2006.01) | |
| *C04B 41/87* | (2006.01) | |
| *C04B 5/00* | (2006.01) | |
| *C04B 7/32* | (2006.01) | |
| *C04B 18/02* | (2006.01) | |
| *C04B 28/06* | (2006.01) | |
| *C04B 35/44* | (2006.01) | |
| *C22C 32/00* | (2006.01) | |
| *C22C 29/12* | (2006.01) | |
| *B32B 18/00* | (2006.01) | |
| *C04B 41/50* | (2006.01) | |
| *C04B 41/00* | (2006.01) | |

(52) U.S. Cl.
CPC .......... *H01J 37/321* (2013.01); *H01J 37/3244* (2013.01); *H01J 37/32458* (2013.01)

(56) References Cited

U.S. PATENT DOCUMENTS

| | | | |
|---|---|---|---|
| 5,916,689 A | 6/1999 | Collins et al. | |
| 6,120,640 A * | 9/2000 | Shih | C23C 28/044 118/719 |
| 6,581,275 B2 | 6/2003 | Narendrnath et al. | |
| 6,783,875 B2 * | 8/2004 | Yamada | B32B 18/00 427/248.1 |
| 6,805,952 B2 * | 10/2004 | Chang | C23C 4/00 118/723 R |
| 7,510,641 B2 | 3/2009 | Kreiskott et al. | |
| 7,696,117 B2 | 4/2010 | Sun et al. | |
| 8,034,734 B2 | 10/2011 | Sun et al. | |
| 8,067,067 B2 * | 11/2011 | Sun | C23C 16/4404 118/715 |
| 8,206,829 B2 | 6/2012 | Sun et al. | |
| 8,562,785 B2 * | 10/2013 | Kang | H01J 37/3244 118/723 I |
| 9,090,046 B2 * | 7/2015 | Sun | B32B 18/00 |
| 2001/0003271 A1 * | 6/2001 | Otsuki | C23C 16/4404 118/723 I |
| 2002/0009560 A1 * | 1/2002 | Ozono | B32B 1/02 428/34.4 |
| 2002/0018921 A1 * | 2/2002 | Yamada | B32B 18/00 428/697 |
| 2002/0105116 A1 * | 8/2002 | Mehrotra | C04B 41/0072 264/641 |
| 2003/0051811 A1 * | 3/2003 | Uchimaru | B32B 18/00 156/345.1 |
| 2003/0232139 A1 | 12/2003 | DeTura | |
| 2004/0009297 A1 | 1/2004 | Fusaro, Jr. et al. | |
| 2005/0037193 A1 | 2/2005 | Sun et al. | |
| 2005/0282034 A1 * | 12/2005 | Hayasaki | C04B 41/009 428/632 |
| 2007/0169891 A1 | 7/2007 | Koshiishi et al. | |
| 2008/0029032 A1 | 2/2008 | Sun et al. | |
| 2008/0106842 A1 * | 5/2008 | Ito | H01L 21/67028 361/234 |
| 2008/0108225 A1 | 5/2008 | Sun et al. | |
| 2008/0174930 A1 * | 7/2008 | Hattori | B23C 43/006 361/234 |
| 2008/0213496 A1 * | 9/2008 | Sun | C23C 4/18 427/453 |
| 2008/0241412 A1 | 10/2008 | Inaki et al. | |
| 2008/0264564 A1 * | 10/2008 | Sun | H01J 37/32467 156/345.1 |
| 2008/0264565 A1 * | 10/2008 | Sun | C04B 35/111 156/345.1 |
| 2008/0268171 A1 * | 10/2008 | Ma | C23C 16/18 427/569 |
| 2009/0036292 A1 | 2/2009 | Sun et al. | |
| 2009/0214825 A1 * | 8/2009 | Sun | C23C 4/11 428/141 |
| 2009/0261065 A1 * | 10/2009 | Singh | C04B 35/48 216/53 |
| 2010/0053841 A1 | 3/2010 | Rusinko, Jr. et al. | |
| 2010/0112192 A1 | 5/2010 | Li et al. | |
| 2010/0119843 A1 | 5/2010 | Sun et al. | |
| 2010/0129670 A1 | 5/2010 | Sun et al. | |
| 2010/0160143 A1 | 6/2010 | Sun et al. | |
| 2011/0198034 A1 | 8/2011 | Sun et al. | |
| 2012/0034469 A1 | 2/2012 | Sun et al. | |
| 2012/0040100 A1 | 2/2012 | Matias et al. | |
| 2012/0104703 A1 | 5/2012 | Sun et al. | |
| 2012/0125488 A1 | 5/2012 | Sun et al. | |
| 2013/0216783 A1 * | 8/2013 | Duan | C04B 35/111 428/143 |
| 2013/0273313 A1 * | 10/2013 | Sun | C03C 17/23 428/137 |
| 2013/0284373 A1 * | 10/2013 | Sun | C23F 1/08 156/345.34 |
| 2014/0116338 A1 * | 5/2014 | He | C23C 14/028 118/723 E |
| 2014/0363596 A1 * | 12/2014 | Sun | C23C 16/4404 428/34.4 |
| 2015/0079370 A1 * | 3/2015 | Sun | C23C 4/128 428/215 |
| 2015/0133285 A1 * | 5/2015 | Sun | C04B 35/50 501/103 |
| 2015/0143677 A1 * | 5/2015 | Sun | C04B 35/486 29/25.01 |
| 2015/0158775 A1 * | 6/2015 | Sun | C04B 41/5045 428/336 |
| 2015/0201461 A1 * | 7/2015 | Duan | B32B 37/24 219/444.1 |
| 2015/0221480 A1 * | 8/2015 | Duan | H01J 37/32477 106/286.5 |
| 2015/0270108 A1 * | 9/2015 | Sun | C23C 16/4404 428/332 |

* cited by examiner

| | | 0 RF-hr | | 50 RF-hrs | | 100 RF-hrs | | 150 RF-hrs | | 200 RF-hrs | | 228 RF-hrs | | 1x PM | |
|---|---|---|---|---|---|---|---|---|---|---|---|---|---|---|---|
| Particles | Mechanical | 84 | | 56 | | 20 | | 32 | | 7 | | 121 | | 67 | |
| | Gas-on | 64 | | 22 | | 263 | | 18 | | 17 | | 59 | | 43 | |
| | Delta | -20 | | -34 | | 243 | | -14 | | 10 | | -62 | | -24 | |
| | RF-on | 18 | | 20 | | -2 | | 9 | | -22 | | 26 | | 23 | |
| Metal contamination (xE10 atoms/cm2) | Al | 0.39 | | <0.10 | | - | | - | | - | | <0.10 | | <0.10 | |
| | Fe | <0.05 | | 0.074 | | - | | - | | - | | <0.05 | | <0.05 | |
| | Y | 0.30 | | 0.046 | | - | | - | | - | | 0.018 | | 0.028 | |
| | Zr | 0.23 | | 0.013 | | - | | - | | - | | <0.005 | | 0.0065 | |
| Particle Chem (EDX) | | CF | | - | | CF, AlF | | - | | - | | CF | | CF | |
| | Recipe | ER (A/min) | 1s (%) | ER (A/min) | 1s (%) | ER (A/min) | 1s (%) | ER (A/min) | 1s (%) | ER (A/min) | 1s (%) | ER (A/min) | 1s (%) | ER (A/min) | 1s (%) |
| ER uniformity | Tier2a1 | 5206 | 8.4 | 5303 | 8.2 | 5264 | 8.7 | 5213 | 9.9 | 5276 | 8.4 | 5308 | 8.8 | 5250 | 10.7 |
| | Tier2b1 | 5055 | 3.9 | 5157 | 3.6 | 5067 | 4.2 | 5042 | 4.2 | 5057 | 3.0 | 5074 | 4.1 | 4987 | 5.0 |
| | Tier2c1 | 4032 | 9.1 | 4146 | 9.6 | 4120 | 9.7 | 4146 | 10.3 | 4144 | 11.6 | 4146 | 11.0 | 4122 | 11.2 |
| | Tier2d1 | 3401 | 4.2 | 3442 | 3.9 | 3447 | 4.0 | 3458 | 3.8 | 3473 | 3.9 | 3450 | 3.8 | 3410 | 3.9 |
| | Tier22 | 4810 | 5.2 | 4911 | 6.1 | 4946 | 4.6 | 4877 | 6.3 | 4832 | 5.6 | 4897 | 4.7 | 4906 | 5.8 |
| | 70Ss 42OxME1 | 4940 | 9.9 | 5008 | 10.7 | 4954 | 11.5 | 5015 | 11.0 | 4955 | 12.5 | 4978 | 12.9 | 5118 | 11.8 |
| | 60s 60OxME1 | 5125 | 12.0 | 5175 | 11.8 | 5160 | 11.9 | 5129 | 13.2 | 5137 | 12.0 | 5170 | 12.3 | 5096 | 10.5 |
| | 90s 60OxME1 | 4936 | 3.8 | 4969 | 3.6 | 4908 | 3.1 | 4962 | 3.2 | 4972 | 3.3 | 4955 | 3.5 | 4907 | 4.1 |

FIG. 9

PLASMA RESISTANT CERAMIC COATED CONDUCTIVE ARTICLE

RELATED APPLICATIONS

This patent application claims the benefit under 35 U.S.C. §119(e) of U.S. Provisional Application No. 61/639,661, filed Apr. 27, 2012.

TECHNICAL FIELD

Embodiments of the present disclosure relate, in general, to ceramic coated articles and to a process for applying a ceramic coating to a conductive substrate. Embodiments further relate to a ceramic coated gas distribution plate for an etcher.

BACKGROUND

In the semiconductor industry, devices are fabricated by a number of manufacturing processes producing structures of an ever-decreasing size. Some manufacturing processes such as plasma etch and plasma clean processes expose a substrate to a high energy plasma combined with a mixture of corrosive gases to etch or clean the substrate. The plasma may be highly corrosive, and may corrode processing chambers and other surfaces that are exposed to the plasma. This corrosion may generate particles, which frequently contaminate the substrate that is being processed, contributing to device defects.

As device geometries shrink, susceptibility to defects increases, and particle contaminant requirements become more stringent. Accordingly, as device geometries shrink, allowable levels of particle contamination may be reduced. To minimize particle contamination introduced by plasma etch and/or plasma clean processes, chamber materials have been developed that are resistant to plasmas. Different materials provide different material properties, such as plasma resistance, rigidity, flexural strength, thermal shock resistance, machining flexibility, and so on. Also, different materials have different material costs. Accordingly, some materials have superior plasma resistance, other materials have lower costs, and still other materials have superior flexural strength and/or thermal shock resistance. Also, some materials (e.g., some yttria based ceramic materials) show good plasma erosion resistivity but bad machining flexibility and bad electrical conductivity, whereas other materials (e.g., aluminum) show the bad plasma erosion resistivity but good machining flexibility and good electrical conductivity.

SUMMARY

In one embodiment, a ceramic coated article includes a conductive substrate and a ceramic coating on the conductive substrate. To manufacture the ceramic coated article, at least one surface of the conductive substrate is roughened, the conductive substrate may be heated, and the conductive substrate is coated with a ceramic coating.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 4B illustrates one embodiment of a top surface of the gas distribution plate shown in FIG. 4a;

DETAILED DESCRIPTION OF EMBODIMENTS

Embodiments of the disclosure are directed to a process for coating a conductive article with a ceramic coating, and to an article created using such a coating process. One example of a conductive article is an aluminum gas distribution plate (also referred to as a showerhead) for a plasma etcher. In one embodiment, the conductive article is roughened, heated, and then coated with a ceramic coating while in a heated state. Alternatively, the conductive article may not be heated. Parameters for the roughening and the coating may be optimized to maximize an adhesion strength of the ceramic coating to the substrate, and thus to reduce future cracking and delamination of the ceramic coating from the conductive article.

The ceramic coating of the article may be highly resistant to plasma etching, and the coated substrate may have superior thermal shock resistance. Performance properties of the coated ceramic article may include a relatively high thermal capability, a relatively long lifespan, and a low on-wafer particle and metal contamination. Accordingly, the combination of a yttria based ceramic material coated on an aluminum metal surface may make it become possible for one electrode (e.g., a gas distribution plate) and/or a complicated shape chamber component to have a significantly improved plasma erosion resistance property over traditional electrodes, gas distribution plates and/or other complicated shape chamber components.

When the terms "about" and "approximately" are used herein, these are intended to mean that the nominal value presented is precise within ±10%. Note also that some embodiments are described herein with reference to gas distribution plates used in plasma etchers for semiconductor manufacturing. However, it should be understood that such plasma etchers may also be used to manufacture micro-electro-mechanical systems (MEMS)) devices. Additionally, the articles described herein may be other structures that are exposed to plasma. For example, the articles may be walls, bases, substrate holding frames, etc. of a plasma etcher, a plasma cleaner, a plasma propulsion system, and so forth.

Moreover, embodiments are described herein with reference to ceramic coated articles that may cause reduced particle contamination when used in a process chamber for plasma rich processes. However, it should be understood that the ceramic coated articles discussed herein may also provide reduced particle contamination when used in process chambers for other processes such as non-plasma etchers, non-plasma cleaners, chemical vapor deposition (CVD) chamber, physical vapor deposition (PVD) chamber, and so forth. Moreover, some embodiments are described with reference to a high performance material (HPM) ceramic coating (described below). However, it should be understood that embodiments equally apply to other plasma resistant ceramics (e.g., other yttrium containing ceramics).

Figure 1:
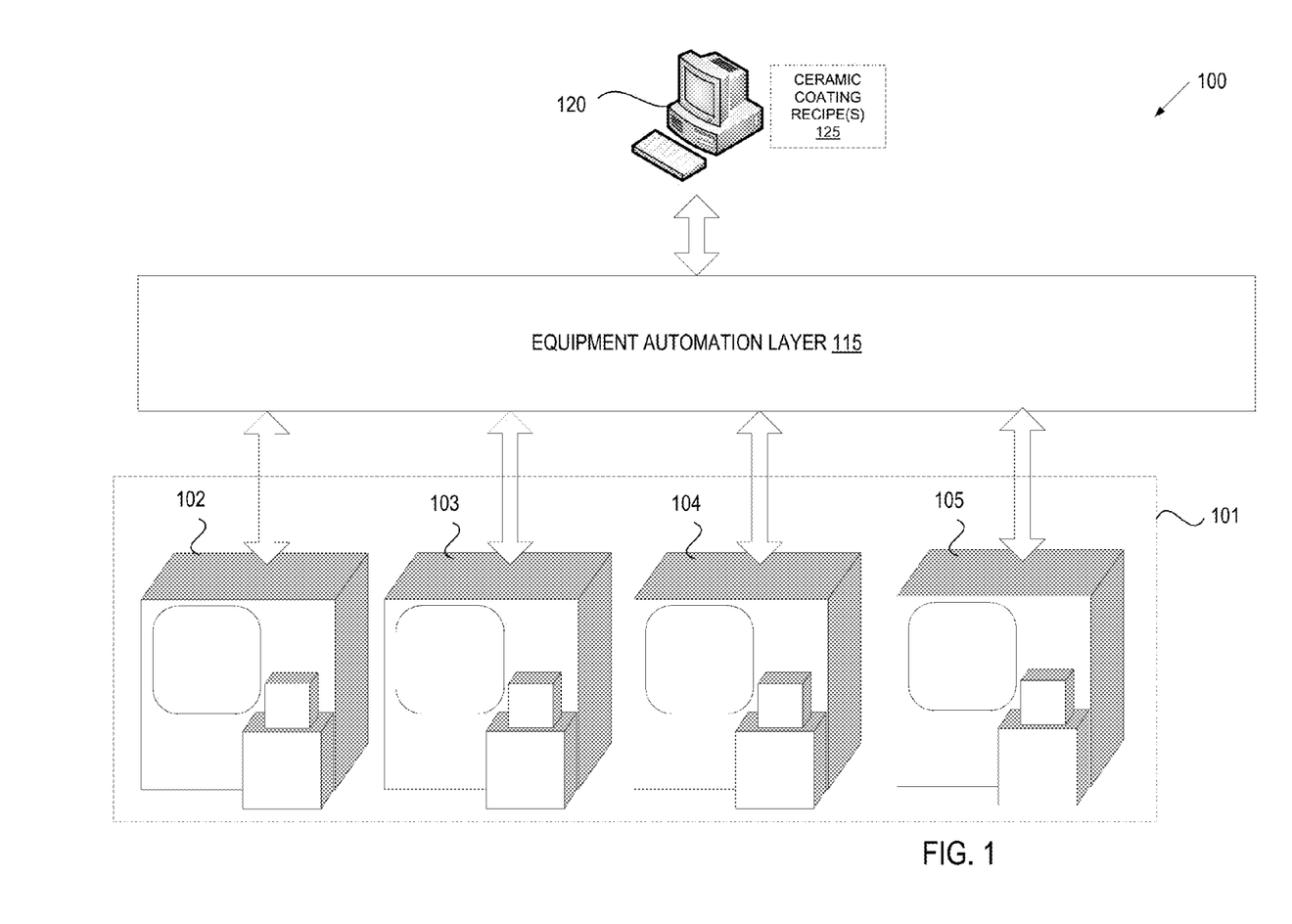
FIG. 1 illustrates an exemplary architecture of a manufacturing system, in accordance with one embodiment of the present invention.

FIG. 1 illustrates an exemplary architecture of a manufacturing system 100. The manufacturing system 100 may be a ceramics manufacturing system. In one embodiment, the manufacturing system 100 includes processing equipment 101 connected to an equipment automation layer 115. The processing equipment 101 may include a bead blaster 102, one or more wet cleaners 103, a ceramic coater 104 and/or one or more grinders 105. The manufacturing system 100 may further include one or more computing device 120 connected to the equipment automation layer 115. In alternative embodiments, the manufacturing system 100 may include more or fewer components. For example, the manufacturing system 100 may include manually operated (e.g., off-line) processing equipment 101 without the equipment automation layer 115 or the computing device 120.

Bead blaster 102 is a machine configured to roughen the surface of articles such as conductive articles. Bead blaster 102 may be a bead blasting cabinet, a hand held bead blaster, an automatic bead blaster, or other type of bead blaster. Bead blaster 102 may roughen a substrate by bombarding the substrate with beads or particles. In one embodiment, bead blaster 102 fires ceramic beads or particles at the substrate. The roughness achieved by the bead blaster 102 may be based on a force used to fire the beads, bead materials, bead sizes, distance of the bead blaster from the substrate, processing duration, and so forth. In one embodiment, the bead blaster uses a range of bead sizes to roughen the ceramic article.

In alternative embodiments, other types of surface rougheners than a bead blaster 102 may be used. For example, a motorized abrasive pad may be used to roughen the surface of ceramic substrates. A sander may rotate or vibrate the abrasive pad while the abrasive pad is pressed against a surface of the conductive article. A roughness achieved by the abrasive pad may depend on an applied pressure, on a vibration or rotation rate and/or on a roughness of the abrasive pad.

Wet cleaners 103 are cleaning apparatuses that clean articles (e.g., conductive articles) using a wet clean process. Wet cleaners 103 include wet baths filled with liquids, in which the substrate is immersed to clean the substrate. Wet cleaners 103 may agitate the wet bath using ultrasonic waves during cleaning to improve a cleaning efficacy. This is referred to herein as sonicating the wet bath. The wet cleaners 103 may clean the conductive substrate at multiple stages during processing. For example, wet cleaners 103 may clean an article after a substrate has been roughened, after a ceramic coating has been applied to the substrate, after the article has been used in processing, and so forth.

In other embodiments, alternative types of cleaners such as dry cleaners may be used to clean the articles. Dry cleaners may clean articles by applying heat, by applying gas, by applying plasma, and so forth.

Ceramic coater 104 is a machine configured to apply a ceramic coating to the surface of a substrate. In one embodiment, ceramic coater 104 is a plasma sprayer that plasma sprays a ceramic coating onto the ceramic substrate. In alternative embodiments, the ceramic coater 104 may apply other thermal spraying techniques such as detonation spraying, wire arc spraying, high velocity oxygen fuel (HVOF) spraying, flame spraying, warm spraying and cold spraying may be used. Additionally, ceramic coater 104 may perform other coating processes such as aerosol deposition, electroplating, ion assisted deposition, physical vapor deposition (PVD), chemical vapor deposition (CVD) and plasma assisted PVD may be used to form the ceramic coating.

Grinders 105 are machines having an abrasive disk that grinds and/or polishes a surface of the article. The grinders 105 may include a polishing/grinding system such as a rough lapping station, a chemical mechanical planarization (CMP) device, and so forth. The grinders 105 may include a platen that holds a substrate and an abrasive disk or polishing pad that is pressed against the substrate while being rotated or rubbed against.

These grinders 105 grind a surface of the ceramic coating to decrease a roughness of the ceramic coating and/or to reduce a thickness of the ceramic coating. The grinders 105 may grind/polish the ceramic coating in multiple steps, where each step uses an abrasive pad with a slightly different roughness and/or a different slurry (e.g., if CMP is used). For example, a first abrasive pad with a high roughness may be used to quickly grind down the ceramic coating to a desired thickness, and a second abrasive pad with a low roughness may be used to polish the ceramic coating to a desired roughness.

The equipment automation layer 115 may interconnect some or all of the manufacturing machines 101 with computing devices 120, with other manufacturing machines, with metrology tools and/or other devices. The equipment automation layer 115 may include a network (e.g., a location area network (LAN)), routers, gateways, servers, data stores, and so on. Manufacturing machines 101 may connect to the equipment automation layer 115 via a SEMI Equipment Communications Standard/Generic Equipment Model (SECS/GEM) interface, via an Ethernet interface, and/or via other interfaces. In one embodiment, the equipment automation layer 115 enables process data (e.g., data collected by manufacturing machines 101 during a process run) to be stored in a data store (not shown). In an alternative embodiment, the computing device 120 connects directly to one or more of the manufacturing machines 101.

In one embodiment, some or all manufacturing machines 101 include a programmable controller that can load, store and execute process recipes. The programmable controller may control temperature settings, gas and/or vacuum settings, time settings, etc. of manufacturing machines 101. The programmable controller may include a main memory (e.g., read-only memory (ROM), flash memory, dynamic random access memory (DRAM), static random access memory (SRAM), etc.), and/or a secondary memory (e.g., a data storage device such as a disk drive). The main memory and/or secondary memory may store instructions for performing heat treatment processes described herein.

The programmable controller may also include a processing device coupled to the main memory and/or secondary memory (e.g., via a bus) to execute the instructions. The processing device may be a general-purpose processing device such as a microprocessor, central processing unit, or the like. The processing device may also be a special-purpose processing device such as an application specific integrated circuit (ASIC), a field programmable gate array (FPGA), a digital signal processor (DSP), network processor, or the like. In one embodiment, programmable controller is a programmable logic controller (PLC).

In one embodiment, the manufacturing machines 101 are programmed to execute recipes that will cause the manufacturing machines to roughen a conductive article (e.g., a metal substrate), clean the conductive article, coat the conductive article and/or machine (e.g., grind or polish) the conductive article. In one embodiment, the manufacturing machines 101 are programmed to execute recipes that perform operations of a multi-step process for manufacturing a ceramic coated article, as described with reference to FIG. 3. The computing device 120 may store one or more ceramic coating recipes 125 that can be downloaded to the manufacturing machines 101 to cause the manufacturing machines 101 to manufacture ceramic coated articles in accordance with embodiments of the present disclosure.

Figure 2:
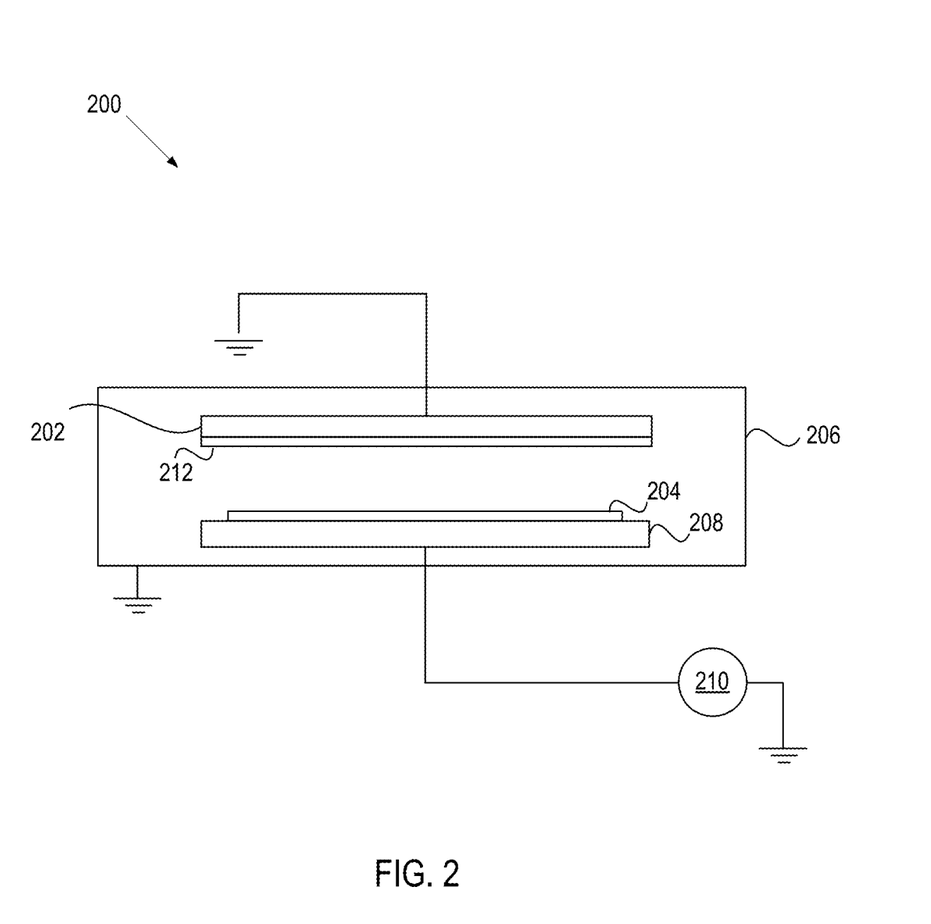
FIG. 2 is a schematic block diagram illustrating one embodiment of a system for using a ceramic coated conductive article.

FIG. 2 is a schematic block diagram illustrating one embodiment of a system 200 for using a gas distribution plate 202. The system 200, in one embodiment, is an etch system (also known as an etcher or an etch reactor) such as a Reactive Ion Etch (RIE), an Inductively Coupled Plasma (ICP), capacitively coupled plasma or a Plasma Etch system that utilizes a parallel plate configuration (e.g., Capacitively Coupled Plasma (CCP)). The system 200 implements a chemically reactive plasma to etch/remove material deposited on a substrate 204 or wafer. The system 200 may be configured for performing a dielectric etch or for performing a conductor etch.

The system 200 comprises a vacuum chamber 206 with a substrate 204 positioned below the gas distribution plate 202. The gas distribution plate 202 functions as an upper electrode that, together with a lower electrode 208, create an electric field that makes gas become a plasma state and accelerates ions towards the surface of the substrate 204. The gas enters the system 200 through inlets formed in the gas distribution plate 202. The types and amounts of gas depend upon the etch material and process, and the plasma may be generated from the gas with an RF powered magnetic field driven by an RF signal generator 210.

The ions and electrons, because of a large voltage difference between the gas distribution plate 202 and the electrode 208, drift towards the substrate 204 and electrode 208 where they collide with the substrate 204, which causes the substrate 204 to be etched. The ions react chemically with the substrate 204. However, due to the velocity of the ions, some ions rebound towards the gas distribution plate and, over the course of time, can react with and corrode the gas distribution plate 202. Also atoms and radicals in plasma may react with the gas distribution plate and degrade the gas distribution plate. Accordingly, in one embodiment, the gas distribution plate 202 may be a conductive material (e.g., aluminum, copper, magnesium, etc.) covered by a ceramic coating 212 deposited on the gas distribution plate 202 to protect and prolong the useful life of the gas distribution plate 202. The ceramic coating 212 may additionally block the formation of AlF and/or other reactants for plasma etch processes (e.g., those that use fluorine gas).

The coating 212 may be formed from a plasma sprayed ceramic such as $Y_2O_3$ (yttria or yttrium oxide), $Y_4Al_2O_9$ (YAM), $YAlO_3$ (YAP), $Y_3Al_5O_{12}$ (YAG), $Al_2O_3$ (alumina or aluminum oxide), Quartz, SiC (silicon carbide), $Si_3N_4$ (silicon nitride), AlN (aluminum nitride), AlON (aluminum oxynitride), $TiO_2$ (titania), $ZrO_2$ (zirconia), TiC (titanium carbide), TiCN, TiN (titanium nitride), ZrC (zirconium carbide), $Y_2O_3$ stabilized $ZrO_2$ (YSZ), and so on. The coating 212 may also be a ceramic composite such as $Y_3Al_5O_{12}$ (YAG) distributed in an $Al_2O_3$ matrix or a $SiC$—$Si_3N_4$ solid solution. In one embodiment, the ceramic coating 212 is a High Performance Material (HPM) coating over the aluminum substrate to form a gas distribution plate 202. The HPM coating may be a ceramic composite composed of a compound $Y_4Al_2O_9$ (YAM) and a solid solution $Y_2$-$xZr_xO_3$ ($Y_2O_3$—$ZrO_2$ solid solution). Note that pure yttrium oxide as well as yttrium oxide containing solid solutions may be doped with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. Note that though the ceramic coating is shown on the gas distribution plate 202, other components of the system 200 may include a ceramic coating instead of or in addition to the gas distribution plate 202.

The gas distribution plate 202 having the ceramic coating 212 may operate in temperatures up to about 180 degrees Celsius (e.g., at temperatures of 150 degrees Celsius in one embodiment). Such operating temperatures may be used without causing the ceramic coating 212 to crack, delaminate, or otherwise degrade over a lifetime of the ceramic coating (e.g., up to a useable lifetime of 5000 hours). This may permit plasma etching to be performed at increased temperatures as compared to plasma etchers that use traditional gas distribution plates without causing detrimental effects such as increased particle contamination, cracking, surface degradation, and so forth. Also, the ceramic coating 212 allows for longer working lifetimes due to the plasma resistance of the ceramic coating 212 and decreased on-wafer or substrate contamination. Beneficially, the ceramic coating 212 may also be stripped and re-coated without affecting the dimensions of the gas distribution plate.

Figure 3:
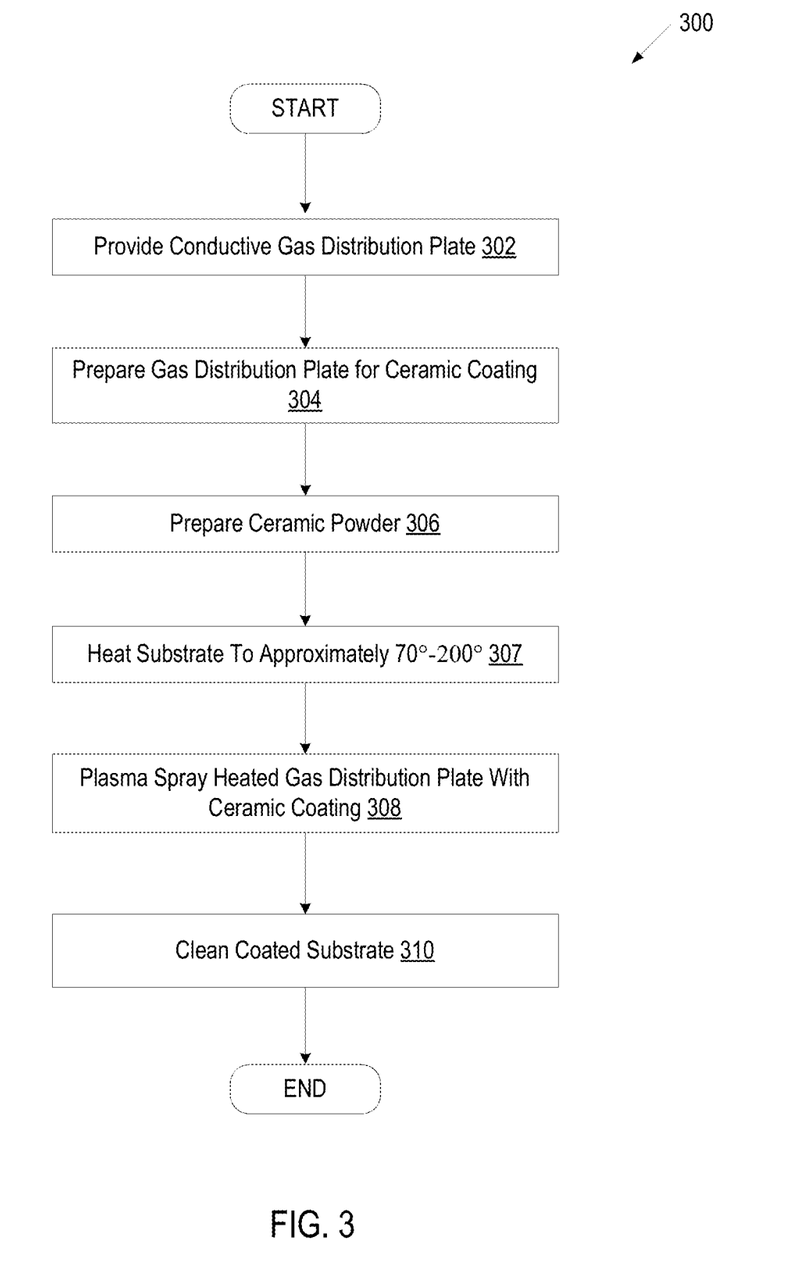
FIG. 3 illustrates a process for manufacturing a ceramic coated conductive article, in accordance with one embodiment of the present invention.

FIG. 3 is a flow chart showing a process 300 for manufacturing a coated conductive article, in accordance with embodiments of the present disclosure. The operations of process 300 may be performed by various manufacturing machines, as set forth in FIG. 1. The steps of process 300 will be described with reference to a "gas distribution plate" as described above, which may be used in a reactive ion etch or plasma etch system. However, the process 300 may be applied to coat any conductive article.

At block 302, the gas distribution plate 202 is provided. The provided gas distribution plate may have a design optimized for receiving a ceramic coating. The gas distribution plate 202 may be a conductive article, which may be formed of aluminum, copper, magnesium, or any other metal or metal alloy. In one embodiment, the gas distribution plate 202 is formed of aluminum. The gas distribution plate 202 is configured with at least one zone for gas-delivery. In a further embodiment, the gas distribution plate is provided with four zones for gas-delivery, with each zone comprising multiple gas channels or conduits extending from a plenum to a surface of the gas distribution plate. Each gas channel or conduit may have a diameter in the range of between about 10 mil (one thousandth of an inch) and 50 mil (e.g., 28 mil in one embodiment). In one embodiment, the gas channels have an average diameter of about 28 mil prior to applying the ceramic coating and an average diameter of about 18+/−3.5 mil after applying the ceramic coating.

At block 304, the gas distribution plate is prepared for coating. The gas distribution plate may be roughened by a bead blaster (or other roughener). In one embodiment, the bead blaster uses ceramic beads to blast the conductive article. The ceramic beads may have a bead size of approximately 0.2-2 mm. In one embodiment, the ceramic beads have a size range of approximately 0.2-2 mm. The bead blaster may bead blast the conductive article with an air pressure of approximately 30-90 psi and a working distance of approximately 50-150 mm, and the blasting angle should be about or slightly less than 90 degree. In one embodiment, the roughened gas distribution plate has a post-blast roughness of approximately 100-300 µin (e.g., 140-240 µin in one embodiment). Roughening the conductive article to an optimal roughness may improve adhesion strength of the ceramic coating.

At block 306, a ceramic powder (e.g., an HPM powder or other yttrium containing ceramic powder) is prepared for spray coating. Raw ceramic powders having specified compositions, purity and particle sizes are selected. The ceramic powder may contain a mixture of one or more of $Y_2O_3$, $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. In one embodiment, the ceramic coating is produced from $Y_2O_3$ powder. The ceramic coating may also be produced from a combination of $Y_2O_3$ powder and $Al_2O_3$. Alternatively, the ceramic coating may be a high performance material (HPM) ceramic composite produced from a mixture of a $Y_2O_3$ powder, $ZrO_2$ powder and $Al_2O_3$ powder. In one embodiment, the HPM ceramic composite contains 77% $Y_2O_3$, 15% $ZrO_2$ and 8% $Al_2O_3$. In another embodiment, the HPM ceramic composite contains 63% $Y_2O_3$, 23% $ZrO_2$ and 14% $Al_2O_3$. In still another embodiment, the HPM ceramic composite contains 55% $Y_2O_3$, 20% $ZrO_2$ and 25% $Al_2O_3$. Other distributions of these ceramic powders may also be used for the HPM material.

The raw ceramic powders are then mixed. In one embodiment, raw ceramic powders of $Y_2O_3$, $Al_2O_3$ and $ZrO_2$ are mixed together. These raw ceramic powders may have a purity of 99.9% or greater in one embodiment. The raw ceramic powders may be mixed using, for example, ball milling. The raw ceramic powders may have a powder size of in the range of between about 100 nm-20 µm. In one embodiment, the raw ceramic powders have a powder size of approximately 5 µm.

After the ceramic powders are mixed, they may be calcinated at a specified calcination time and temperature. In one embodiment, a calcination temperature of approximately 1200-1600° C. (e.g., 1400° C. in one embodiment) and a calcination time of approximately 2-5 hours (e.g., 3 hours in one embodiment) is used. The spray dried granular particle size for the mixed powder may have a size distribution of approximately 30 µm.

At block 307, the gas distribution plate is heated. The gas distribution plate may be heated to a temperature of up to about 300° C. in one embodiment. In another embodiment, the gas distribution plate may be heated to a temperature of up to about 150° C. In still another embodiment, the gas distribution plate may be heated to a temperature of about 70° C. to about 110° C. In yet another embodiment, the gas distribution plate is not externally heated. Instead, the plasma deposition may be performed in a manner such that a coating face of the substrate naturally heats up to a desired temperature as a result of the plasma spraying process.

Due to the mismatch of thermal expansion coefficients between the gas distribution plate (formed of a conductive substrate such as metal) and the ceramic coating, a coating applied at room temperature is highly susceptible to cracking during an etch process. This is because a conductive article (e.g., metal or metal alloy such as aluminum, copper, iron, etc.) will expand at a greater rate than the ceramic coating, causing a tension force that forms cracks, delamination and other deformities in the ceramic coating. However, the ceramic coating is much more resilient under compressive forces. As such, the gas distribution plate is heated, and subsequently expanded, before the plasma spray coating is applied. As the gas distribution plate cools and shrinks, the ceramic coating is compressed. This method for plasma spraying a coating and then cooling may improve the performance of the ceramic coating because the coating is compressed as the conductive article contracts and the ceramic coating, therefore, is densified. When the gas distribution plate is later heated during processing, it may be heated to at least approximately the temperature that the gas distribution plate had during the plasma spraying without causing tensile forces on the plasma coating. Additionally, the gas distribution plate may be heated to above this temperature during processing, which may cause tensile pressures that are not significant enough to cause cracking in the ceramic coating. This may reduce or eliminate cracking of the ceramic coating during processing at high temperatures.

At block 308, the heated gas distribution plate is plasma coated with the HPM ceramic coating using a plasma spray coating technique or a thermal spraying technique. The coating coverage may be in the range of between about 92% and 99% of the surface of the gas distribution plate 202. In one embodiment, the ceramic coating 212 is a yttrium oxide containing ceramic. Thermal spraying techniques and plasma spraying techniques may melt materials (e.g., ceramic powders) and spray the melted materials onto the ceramic substrate.

In one embodiment, an inert gas is flowed through openings (e.g., channels or conduits) in the gas distribution plate during the plasma spraying. The gas may flow in an opposite direction to a direction that the plasma is sprayed. This may prevent the openings from becoming plugged by the ceramic coating.

The thermally sprayed or plasma sprayed ceramic coating may have a thickness about 10-40 mil (e.g., 25 mil in one embodiment). The thickness, in one example, is selected according to an erosion rate of the ceramic coating to ensure that the gas distribution plate has a useful life of approximately 5000 Radio Frequency Hours (RFHrs). In other words, if the erosion rate of a particular ceramic coating formulation is about 0.005 mil/hr, then for a useful life of about 5000 RFHrs, a ceramic coating having a thickness of about 25 mil may be formed.

In one embodiment, a plasma power of approximately 50-100 kilo-Watts (kW) is used to plasma spray the ceramic coating onto the conductive article. The plasma spray process may be performed in multiple spray passes. Passes may have a nozzle moving speed of approximately 500-2000 mm/second. For each pass, the angle of a plasma spray nozzle may change to maintain a relative angle to a surface that is being sprayed. For example, the plasma spray nozzle may be rotated to maintain an angle of approximately 45 degrees to approximately 90 degrees with the surface of the conductive article being sprayed. Each pass may deposit a thickness of up to approximately 100 µm (or about 4 mil). The plasma spray process may be performed using a range of between about 3-15 passes to achieve a ceramic coating thickness of around 10-40 mil. Alternatively, more passes may be performed, with each pass having less then 100 µm.

The ceramic coating may have a porosity of approximately 0.5-5% (e.g., less than approximately 5% in one embodiment), a hardness of approximately 4-8 gigapascals (GPa) (e.g., greater than approximately 4 GPa in one embodiment), and an adhesion strength of approximately 14-24 megapascals (MPa). Adhesion strength may be determined by applying a normal force (e.g., measured in megapascals) to the ceramic coating until the ceramic coating peels off from the ceramic substrate. The ceramic coating may additionally have a thermal shock resistance sufficient to withstand plasma etching at temperature variations of 0 degrees Celsius to around 180 degrees Celsius. For example, thermal shock resistance may be determined by measuring an adhesion strength of the ceramic coating after performing thermal cycling of the coated conductive article and comparing to an adhesion strength prior measured prior to performing the thermal cycling. The adhesion strength of the ceramic coating may remain relatively unchanged due to the thermal cycling, showing a high thermal shock resistance.

At block 310, the coated gas distribution plate is cleaned. The gas distribution plate may be cleaned using one or more wet cleaners. Each wet cleaner may contain one or more wet baths with various liquids, such as deionized (DI) water and acetone. In one embodiment, a wet cleaner executes a cleaning recipe that cleans the conductive article for 10 minutes in a DI water bath, while ultrasonically agitating the DI water bath with a frequency 10-100 kHz and a power density of up to 100%.

After cleaning, the gas distribution plate may have a particle count of up to approximately 100,000/cm2 for particles having a size of bigger than 0.2 microns. Measured parameters that represent particle count are a tape peel test particle count, a laser particle count and a liquid particle count (LPC).

Figure 4A:
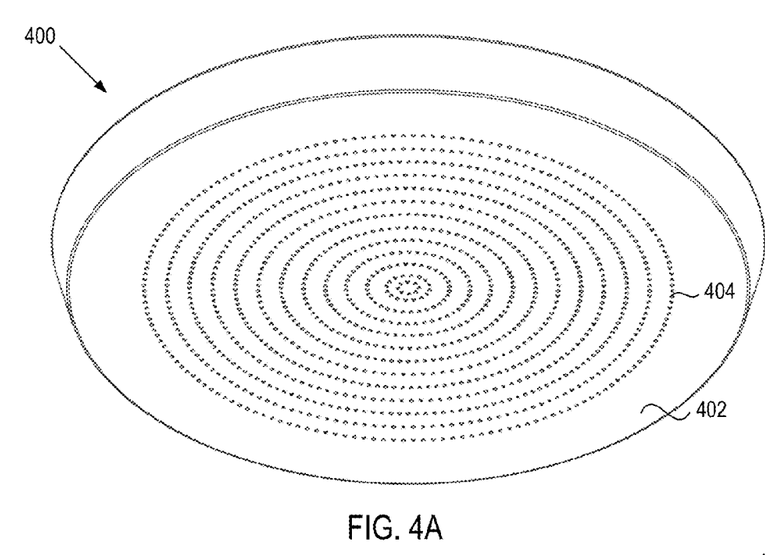
FIG. 4A illustrates one embodiment of a bottom surface of a gas distribution plate.

FIG. 4A illustrates one embodiment of a bottom view of a gas distribution plate 400. The gas distribution plate 400, as depicted here, is formed having a lower surface 402 configured to receive a plasma resistant ceramic coating as described above. The gas distribution plate 400 may be formed having a series of gas conduits 404 arranged concentrically that evenly distribute plasma gasses directly over a substrate or wafer to be etched as described above in FIG. 2.

The gas distribution plate 400 is depicted here having approximately 1100 gas conduits 404 arranged in evenly distributed concentric rings for even distributing of gasses. In another embodiment, the gas conduits 404 may be configured in alternative geometric configurations on the lower surface 402 of the gas distribution plate. For example, the gas distribution plate 400 may have a square or rectangular configuration having rows and columns of gas conduits 404. It is to be understood that other shapes (e.g., triangle, pentagon, etc.) may be implemented and coated with a ceramic coating (e.g., an HPM coating) as described above.

The gas distribution plate 400 can have many gas conduits 404, as depicted, or as few gas conduits as needed depending on the type of reactor and/or process utilized. The spacing between the gas conduits 404, in one embodiment, is in the range of between about 20 and 50 mil, with the spacing between rings of gas conduits 404 being in the range of between about 0.5 and 1 inch. Alternatively, any spacing of conduits 404 and rings of conduits 404 may be utilized according to the type of reactor and/or type of process to be performed.

In one embodiment, some or all gas conduits 404 do not include branches (e.g., each gas conduit may have a single entry point and a single exit point). Additionally, the gas conduits may have various lengths and orientation angles. Gas may be delivered to the gas conduits 404 via one or more gas delivery nozzles. Some gas conduits 404 may receive the gas before other gas conduits 404 (e.g., due to a proximity to a gas delivery nozzle). However, the gas conduits 404 may be configured to deliver gas to a substrate resting beneath the gas distribution plate at approximately the same time based on varying the orientation angles, diameters and/or lengths of the gas conduits 404, or by using an additional flow equalizer. For example, gas conduits 404 that will receive gas first may be longer and/or have a greater angle (e.g., an angle that is further from 90 degrees) than conduits that will receive gas later.

Figure 4B:
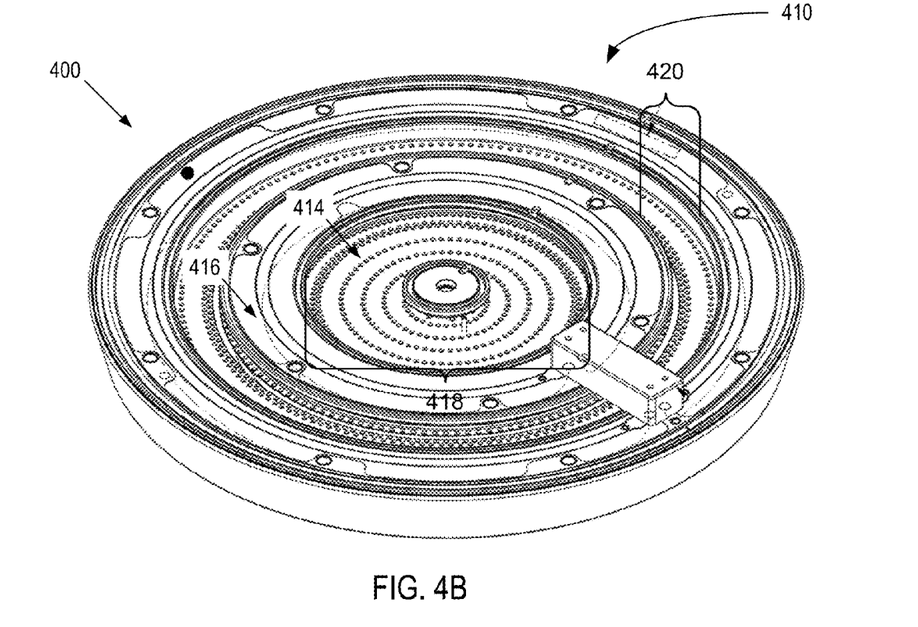

FIG. 4B illustrates one embodiment of a top surface 410 of the gas distribution plate 400. The top surface 410 of the gas distribution plate 400 engages a chill plate and a gas distribution system. The gas distribution system (not shown) delivers one or more individual gases or gas mixtures to plenums 412 formed in the top surface 410 of the gas distribution plate 400. Plenums 412, as used herein, are chambers formed between the gas distribution plate 400 and the chill plate. The gas conduits 404 fluidly couple the plenums 412 in the top surface 410 of the gas distribution plate with the lower surface 402 of the gas distribution plate 400, thereby distributing gasses that may be delivered evenly across the surface of a substrate.

Rings 414 of conduits 404 may be distributed within regions. In one example, a region is defined as conduits 404 that are fluidly coupled with a common plenum 412 area. In the depicted embodiment, the gas distribution plate 400 comprises an inner region 418 and an outer region 420. The regions may be separated by thermal breaks 416. Thermal breaks 416 provide a resistance to heat flow between regions. Accordingly, temperatures of the inner 418 region and the outer region 420 may be maintained separately. For example, the inner region 418 may be heated to a different temperature than the outer region 420.

Figure 5:
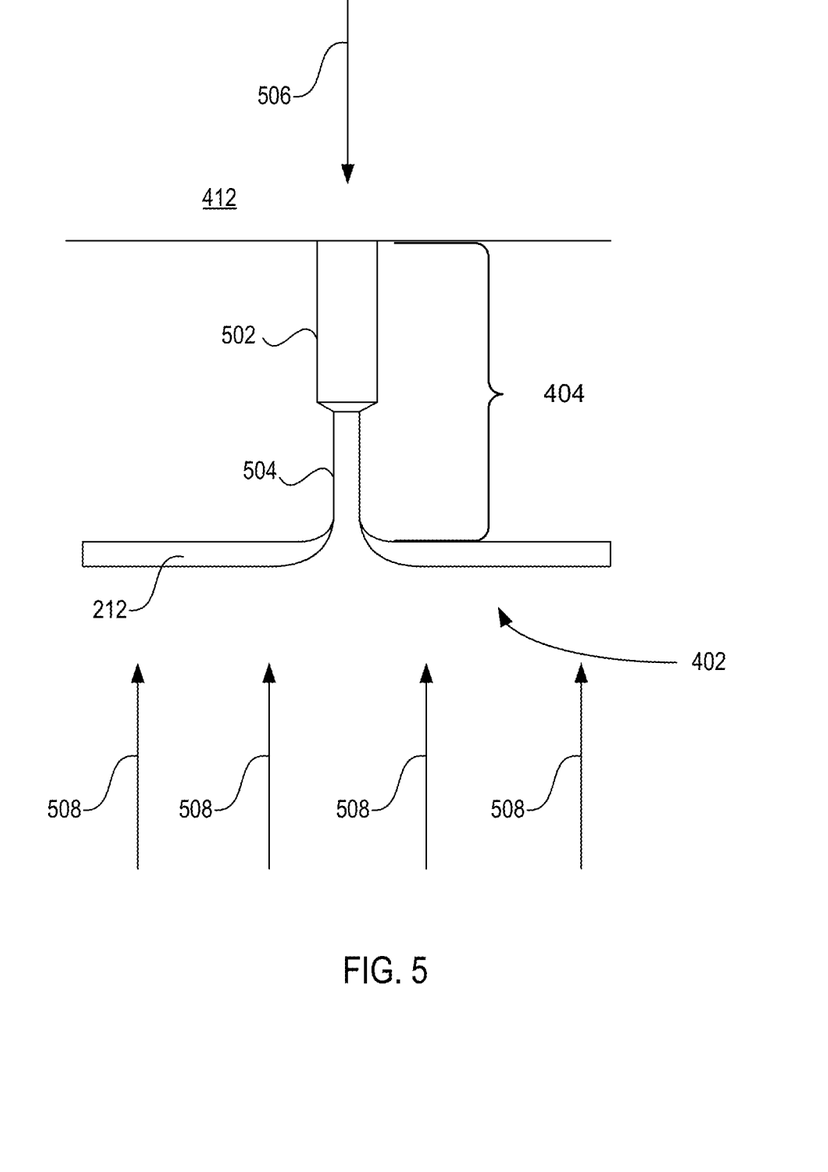
FIG. 5 illustrates a cross-sectional view of one embodiment of a gas conduit of a gas distribution plate.

FIG. 5 is a cross-sectional diagram illustrating one embodiment of a gas conduit 404 of a gas distribution plate. The conduit 404, in one embodiment, fluidly couples the plenum area 412 with the lower surface 402 of the gas distribution plate. A ceramic coating 212, as described previously, is plasma sprayed (or thermally sprayed) onto the lower surface 402 of the gas distribution plate to protect and extend the working life of the gas distribution plate, and/or to block undesirable reactions from occurring during plasma etching.

In one embodiment, during the coating process, gas is flowed through the conduits 404, in a direction indicated by arrow 506, to prevent the coating 212 from plugging or blocking the gas conduits 404. The gas may be an inert gas such as Nitrogen or Argon. The gas may flow through the channel 404 with a pressure and flow rate that are sufficient to prevent the sprayed ceramic from entering and plugging the channel 404 during the coating process. The coating 212 is plasma sprayed on a surface of the gas distribution plate 404 in a direction indicated by arrows 508.

Each conduit 404 may comprise an upper region 502 and a narrower lower region 504. The narrower lower region 504 helps promote even gas flow across all gas conduits 404 by restricting the rate at which gas may flow through the conduit 404. This may ensure that there is not an "easiest" path for gas to exit the plenum area 412, and thus result in an evenly distributed gas flow through the various gas conduits 404. The diameter of the upper region 502, in one embodiment, is in the range of between about 40 and 80 mil (e.g., 62 mil in one embodiment). The diameter of the lower region 504 is, for example, in the range of between about 10 and 40 mil (e.g., 28 mil in one embodiment).

The lengths of the upper and lower regions 502, 504 may be selected according to a desired process and type of reactor to be utilized. The lengths and diameters may be selected to prevent arcing during processing.

Figure 6:
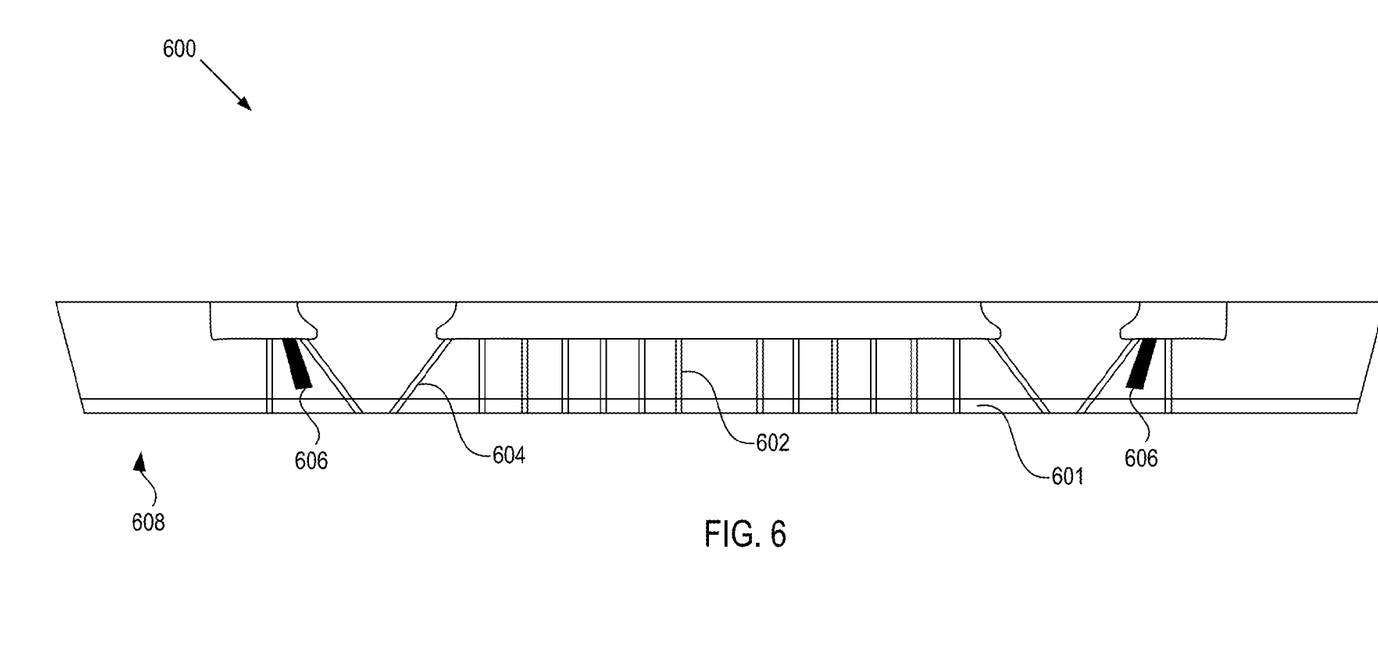
FIG. 6 illustrates a cross-sectional view of one embodiment of a gas distribution plate.

FIG. 6 illustrates one embodiment of a cross-sectional side view of a gas distribution plate 600 having a ceramic coating 601. The gas distribution plate 600 depicted herein omits many features of the gas distribution plate for clarity only, and is not intended to be a limiting embodiment. The gas distribution plate 600 may be formed having substantially perpendicular gas conduits 602 and gas conduits 604 oriented at an angle that is not perpendicular to the bottom face 608 of the gas distribution plate. These non-perpendicular gas conduits 604 are positioned on both sides of a thermal break 606 and beneficially allow the positioning and size of thermal break desired while still allowing for the even distribution of gasses.

The non-perpendicular gas conduits 604 may have a length, angle and/or diameter selected to achieve a substantially equivalent flow rate of the perpendicular gas conduits 602. The non-perpendicular gas conduits 602 may be formed in a manner similar to the gas conduit of FIG. 5, that is, with an upper region and a narrower lower region.

Figure 7:
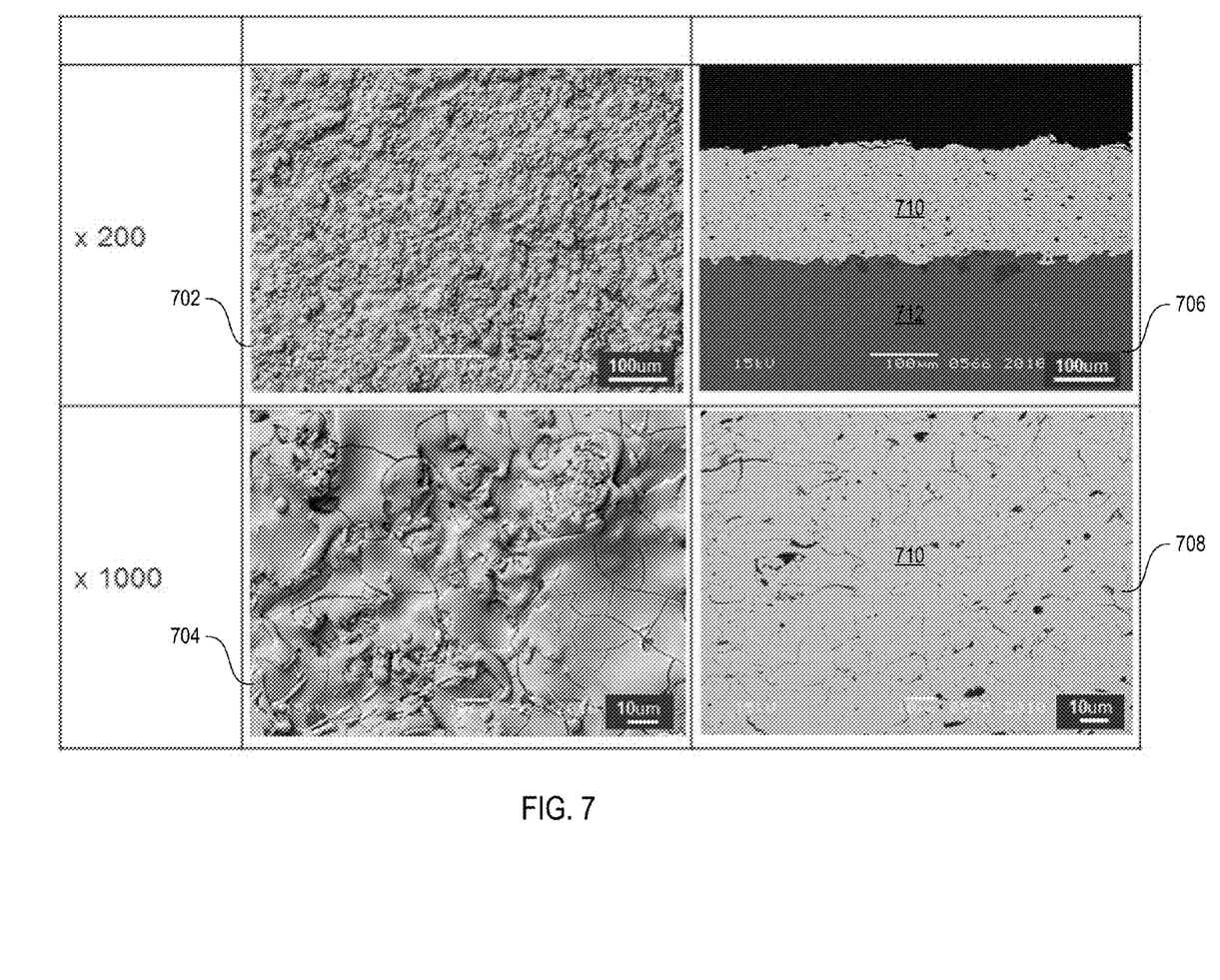
FIG. 7 shows micrographs of a ceramic coating at both 200 and 1000-fold magnifications of top-down and cross-sectional views of a ceramic coating.

FIG. 7 illustrates micrographs 702, 704, 706, 708 of the a ceramic coating at both 200 and 1000-fold magnifications of top-down and cross-sectional views after the ceramic coating is plasma sprayed onto a conductive article. The microstructure is unchanged after being heat-cycled from room temperature to operating temperature multiple times. This illustrates the ability of the coating to withstand thermal shock. In one embodiment, the ceramic coating is an HPM coating, as described above.

Figure 8:
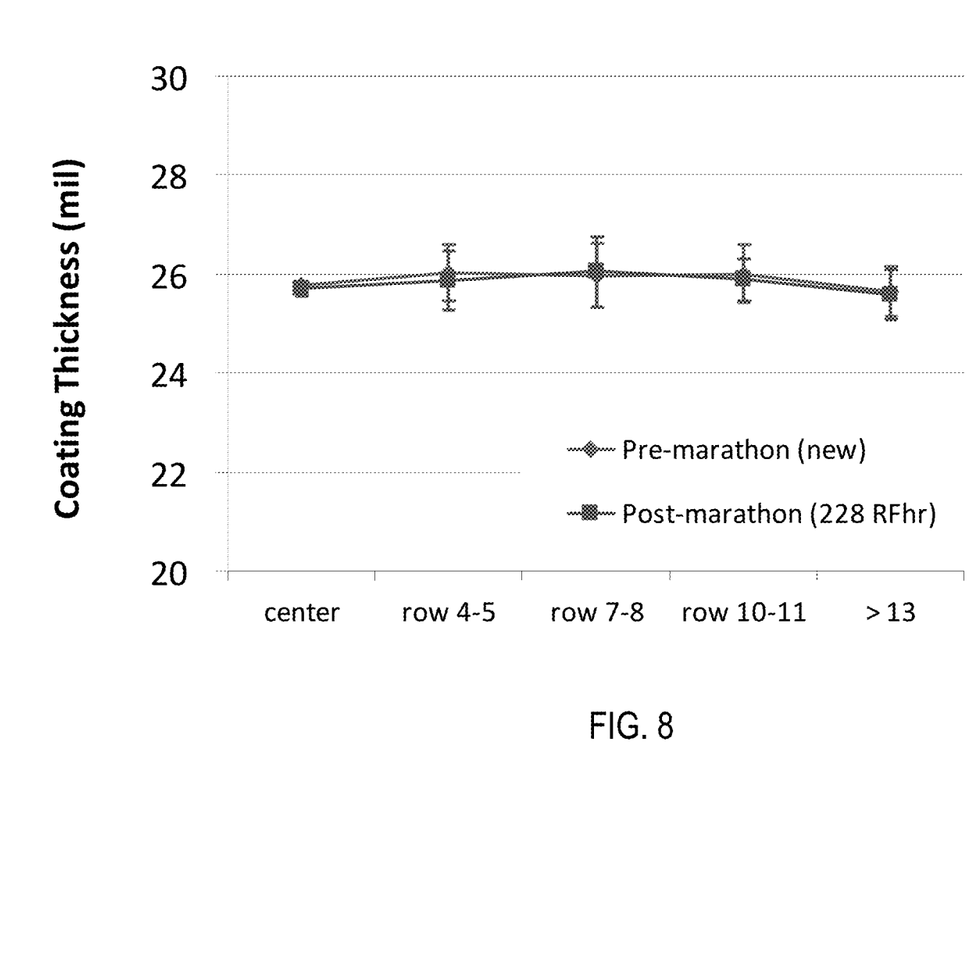
FIG. 8 illustrates coating thickness of the gas distribution plate before and after plasma exposure.

Top view micrographs 702, 704 illustrate one example of an HPM coating over an aluminum conductive article using the process of FIG. 3 described above. Cross-sectional micrograph 706 illustrates a plasma sprayed ceramic coating 710 coupled with an aluminum conductive article 712. Cross sectional micrograph 708 illustrates a 1000-fold magnification of the HPM coating 710. gas distribution plate FIG. 8 illustrates pre and post plasma exposure coating thickness of a ceramic coated gas distribution plate over time. The term "marathon" refers to a prolonged process of cycling the gas distribution plate through multiple plasma etches. In other words, each cycle consists of heating the gas distribution plate from room temperature to an operating temperature of about 150 degrees Celsius, performing a plasma etch, and cooling the gas distribution plate back to room temperature.

The "pre-marathon" line shows a coating thickness at different locations across the gas distribution plate identified by specific ring or circular row of gas conduits (e.g., center ring, row 4-5, etc.). Following a 228 RFHr "marathon," the thickness of the coating is substantially equivalent to the pre-marathon coating. Stated differently, the ceramic coating resists erosion due to bombardment of ions during the etch process.

Figure 9:
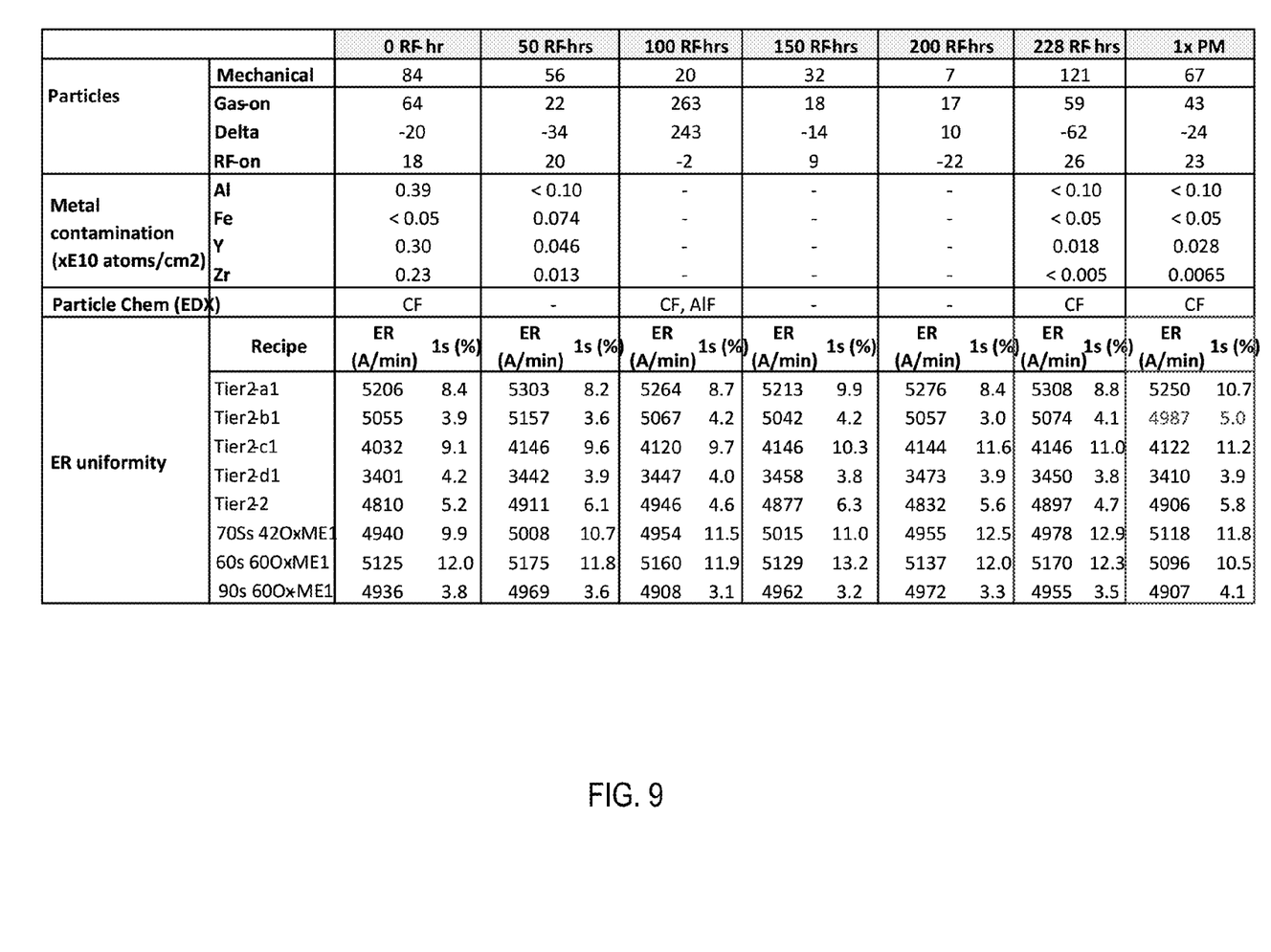
FIG. 9 illustrates a table of on-wafer performance of the gas distribution plate during a 230 RFhr etch run.

FIG. 9 illustrates a table of on-wafer performance using different etch recipes for high aspect ratio (HARC) plasma etching. Measurements are shown regarding the performance of an HPM coating that include particles, metal contamination (e.g., of AL, Fe, Y and Zr), as well as etch rate (ER) and etch rate uniformity. The particles represent on-wafer particle counts, and include mechanical particle counts, gas-on particle counts, delta particle counts and RF-on particle counts. Mechanical particle counts are taken after a mechanical transfer sequence is performed on a substrate. The mechanical particle counts identify particle defects caused by a chamber body, robot system, main frame, and so on. The gas-on particle counts are taken after performing the mechanical transfer sequence and then running gas through a gas distribution plate. The delta particle counts are the difference between the mechanical particle count and the gas-on particle count, and so represent just the particle count contribution caused by running the gas. The RF-on particle counts are taken after a plasma is run through the gas distribution plate.

The measurements are taken after different amounts of processing using various plasma etch recipes. Each etch recipe (e.g., Tier2-a1, Tier2-b1, Tier2-c1, and so on) has an etch rate (ER) measured in Angstroms per minute (A/min) and a uniformity measured in a single standard deviation (e.g., 8.4% for Tier2-a1, 3.9% for Tier2-b1, and so on). Measurements are taken before using the gas distribution plate in processing, after 50 RFhr, after 100 RFhr, after 150 RFhr, after 200 RFhr and after 228 RFhr. As shown, the metal contamination remained approximately steady between tests. Additionally, particles remained approximately steady between tests. This illustrates that the ceramic coating does not noticeably degrade after 228 RFhr of processing. The HPM coating may also not degrade noticeably after additional processing, such as after 250 RFhr, after 500 RFhr, after 1000 RFhr, and so on.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or."

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A component of a plasma etch reactor comprising:
   a metal portion of the component having a roughened surface with a roughness of approximately 100 microinches (µin) to approximately 300 µin, wherein the metal portion of the component comprises a first region and a second region thermally isolated from the first region by a thermal break; and
   a ceramic coating on the roughened surface of the metal portion of the component, wherein the ceramic coating comprises a yttrium containing oxide, the ceramic coating having a thickness of approximately 10-40 mil, wherein the ceramic coating has a thermal shock resistance sufficient for use at a temperature of up to approximately 150 degrees Celsius.

2. The component of claim 1, wherein the component is a gas distribution plate.

3. The component of claim 2, further comprising:
   a plurality of approximately linear gas channels in the metal portion of the component, each of the plurality of approximately linear gas channels having a first end that receives a gas and a second end that delivers the gas, wherein the first end has a larger diameter than the second end.

4. The component of claim 1, wherein the metal portion of the component comprises at least one of aluminum, copper or magnesium.

5. The component of claim 1, wherein the ceramic coating is selected from a list consisting of $Y_2O_3$, $Y_3Al_5O_{12}$ (YAG) and $Y_2O_3$ stabilized $ZrO_2$.

6. The component of claim 1, wherein the ceramic coating is a composite comprising $Y_4Al_2O_9$ (YAM) and a solid solution of $Y_2$-$xZr_xO_3$.

7. The component of claim 2, further comprising:
a plurality of approximately linear gas channels in the metal portion, each of the plurality of approximately linear gas channels having a first end that receives a gas and a second end that delivers the gas, wherein the first end has smaller diameter than the second end.

8. The component of claim 1, wherein the ceramic coating is under a compressive stress at room temperature.

9. The component of claim 1, wherein the ceramic coating is a plasma sprayed ceramic coating having a porosity of less than approximately 5%.

10. The component of claim 2, wherein the gas distribution plate comprises a first plurality of conduits having a first length and a first orientation angle and a second plurality of conduits having a second length and a second orientation angle that are different from the first length and the first orientation angle.

11. The component of claim 10, wherein the first plurality of conduits are substantially perpendicular to the roughened surface of the metal portion and are to have a first flow rate, wherein the second plurality of conduits are oriented at an angle that is not perpendicular to the roughened surface, and wherein the second plurality of gas conduits have a length, an angle and a diameter that facilitates a second flow rate that is substantially equivalent to the first flow rate.

12. The component of claim 3, wherein the first end has a diameter of about 40-80 mil and the second end has a diameter of about 10-40 mil.

13. A component of a plasma etch reactor comprising:
a metal portion of the component having a roughened surface with a roughness of approximately 100 microinches ($\mu$in) to approximately 300 $\mu$in; and
a ceramic coating on the roughened surface of the metal portion of the component, wherein the ceramic coating is a composite comprising $Y_4Al_2O_9$ (YAM) and a solid solution of $Y_2$-$xZr_xO_3$, the ceramic coating having a thickness of approximately 10-40 mil, wherein the ceramic coating has a thermal shock resistance sufficient for use at a temperature of up to approximately 150 degrees Celsius.

14. The component of claim 13, wherein the component is a gas distribution plate that comprises at least one of aluminum, copper or magnesium.

15. The component of claim 13, further comprising:
a plurality of approximately linear gas channels in the metal portion of the component, each of the plurality of approximately linear gas channels having a first end that receives a gas and a second end that delivers the gas, wherein the first end has a larger diameter than the second end.

16. The component of claim 13, wherein the ceramic coating is under a compressive stress at room temperature, and wherein the ceramic coating is a plasma sprayed ceramic coating having a porosity of less than approximately 5%.

17. A component of a plasma etch reactor comprising:
a metal portion of the component having a roughened surface with a roughness of approximately 100 microinches ($\mu$in) to approximately 300 $\mu$in; and
a ceramic coating on the roughened surface of the metal portion of the component, wherein the ceramic coating is selected from a list consisting of $Y_3Al_5O_{12}$ (YAG) and $Y_2O_3$ stabilized $ZrO_2$, the ceramic coating having a thickness of approximately 10-40 mil, wherein the ceramic coating has a thermal shock resistance sufficient for use at a temperature of up to approximately 150 degrees Celsius.

18. The component of claim 17, wherein the component is a gas distribution plate that comprises at least one of aluminum, copper or magnesium.

19. The component of claim 17, further comprising:
a plurality of approximately linear gas channels in the metal portion of the component, each of the plurality of approximately linear gas channels having a first end that receives a gas and a second end that delivers the gas, wherein the first end has a larger diameter than the second end.

20. The component of claim 17, wherein the ceramic coating is under a compressive stress at room temperature, and wherein the ceramic coating is a plasma sprayed ceramic coating having a porosity of less than approximately 5%.

* * * * *